United States Patent [19]

Natarajan et al.

[11] Patent Number: 5,785,800

[45] Date of Patent: Jul. 28, 1998

[54] APPARATUS FOR FORMING CAVITY STRUCTURES USING THERMALLY DECOMPOSABLE SURFACE LAYER

[75] Inventors: Govindarajan Natarajan, Pleasant Valley; Niranjan M. Patel, Wappingers Falls; Kurt A. Smith, Poughkeepsie, all of N.Y.

[73] Assignee: International Business Machines Corporation, Armonk, N.Y.

[21] Appl. No.: 668,294

[22] Filed: Jun. 21, 1996

[51] Int. Cl.$^6$ .................................................. B32B 31/20
[52] U.S. Cl. ........................ 156/382; 156/89; 156/580; 425/111; 425/388; 428/137; 428/138; 428/901
[58] Field of Search ........................ 156/89, 156, 285, 156/289, 323, 381, 382, 580, 583.1; 264/56, 58, 60, 61, 241, 313, 316; 425/111, 388; 428/137, 138, 901

[56] References Cited

U.S. PATENT DOCUMENTS

| | | | |
|---|---|---|---|
| 4,636,275 | 1/1987 | Norell | 156/289 |
| 4,680,075 | 7/1987 | McNeal et al. | 156/289 |
| 4,704,082 | 11/1987 | Buehler | 425/405 H |
| 4,737,208 | 4/1988 | Bloechle et al. | 156/90 |
| 4,749,421 | 6/1988 | Matsui et al. | 156/89 |
| 4,766,671 | 8/1988 | Utsumi et al. | 156/89 X |
| 4,833,000 | 5/1989 | Trickett et al. | 428/137 |
| 5,037,599 | 8/1991 | Olson | 264/510 |
| 5,057,171 | 10/1991 | Homer et al. | 156/89 |
| 5,108,532 | 4/1992 | Thein et al. | 156/285 |
| 5,254,191 | 10/1993 | Mikeska et al. | 156/89 |
| 5,468,315 | 11/1995 | Okada et al. | 156/64 |
| 5,478,420 | 12/1995 | Gauci et al. | 156/89 |
| 5,538,582 | 7/1996 | Natarajan et al. | 156/285 |

FOREIGN PATENT DOCUMENTS

| | | |
|---|---|---|
| 04-083760 | 3/1992 | Japan . |
| 04-152107 | 5/1992 | Japan . |
| 06-320523 | 11/1994 | Japan . |

OTHER PUBLICATIONS

G. C. Phillips, Jr., "Fixture for Fabricating Complex Substrate Design from Green Sheet Ceramics", IBM Technical Disclosure Bulletin, vol. 16, No. 11, Apr. 1974, p. 3559.

*Primary Examiner*—James Sells
*Attorney, Agent, or Firm*—Ira D. Blecker; Aziz M. Ahsan

[57] ABSTRACT

The present invention relates generally to a new apparatus and method for forming cavities in semiconductor substrates without the necessity of using an insert. More particularly, the invention encompasses an apparatus and a method for fabricating cavities in semiconductor substrates wherein a thermally decomposable surface layer is placed over the cavity prior to lamination and caused to conform to the contour of the cavity, thus preventing collapse of, or damage to, the cavity shelves during the lamination process. After the lamination process, the thermally decomposable surface layer is conveniently removed in pyrolysis and binder removal segments of the sinter process without causing damage to the cavity shelves or paste pull-outs.

24 Claims, 2 Drawing Sheets

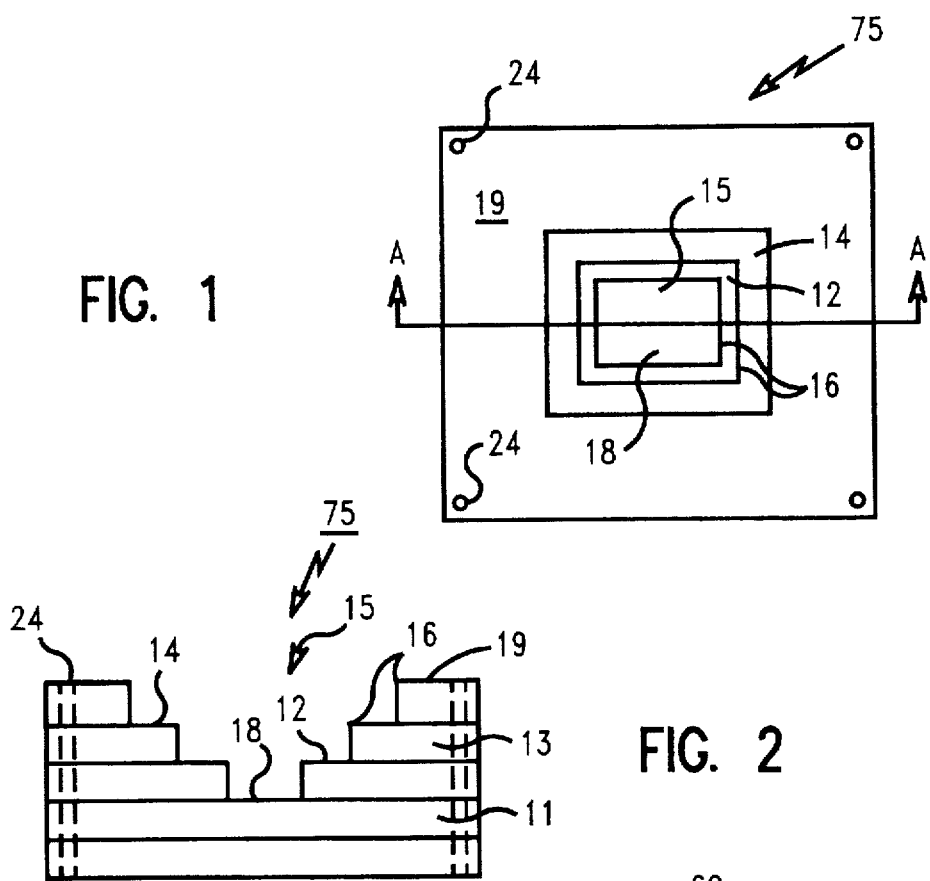
FIG. 1
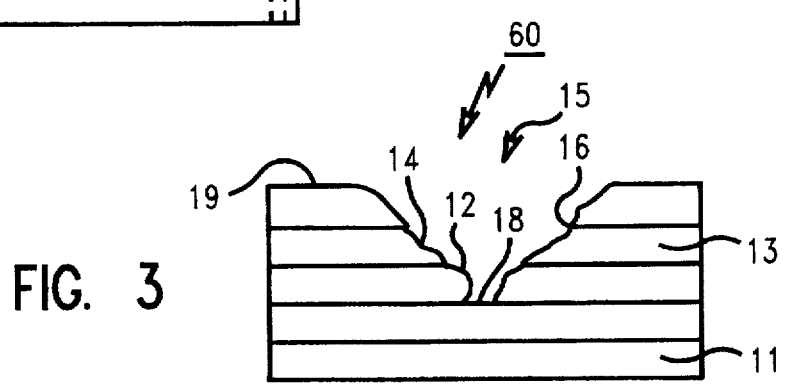
FIG. 2
FIG. 3
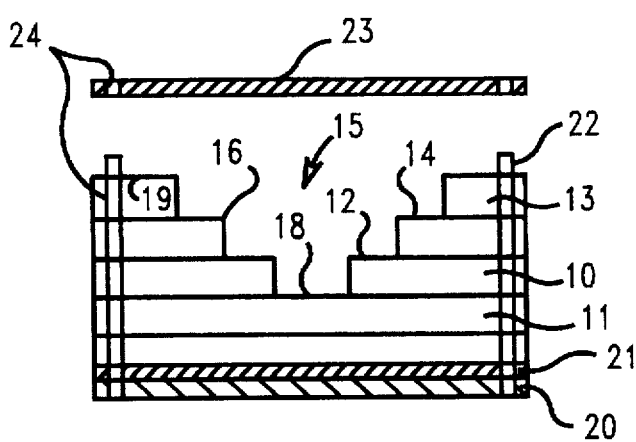
FIG. 4

APPARATUS FOR FORMING CAVITY STRUCTURES USING THERMALLY DECOMPOSABLE SURFACE LAYER

CROSS-REFERENCE TO RELATED PATENT APPLICATION

This Patent Application is related to U.S. patent application Ser. No. 08/668,293, filed on Jun. 21, 1996, Attorney Docket No. FI9-95-176, entitled "Method For Forming Cavity Structures Using Thermally Decomposable Surface Layer", presently assigned to the assignee of the instant Patent Application, and the disclosure of which is incorporated herein by reference.

FIELD OF THE INVENTION

The present invention relates generally to a new apparatus and method for forming cavities in semiconductor substrates using at least one surface layer that adheres to at least a portion of the cavity and is decomposable.

BACKGROUND OF THE INVENTION

Semiconductor substrates and devices are becoming smaller and more dense with the evolution of new technologies. However, increases in circuit density produce a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which effect both yield and reliability. Historically, screening techniques have been employed to improve product failure rates to acceptable levels by culling out many of these random defects.

In their desire to improve their products, the semiconductor manufacturers are constantly finding new ways and new techniques to improve or provide new products. It has been found that for some applications, one could make a ceramic carrier or substrate (hereafter just substrate) having a cavity and then have the semiconductor chip placed inside the cavity and secured to the substrate. These semiconductor substrates are often referred to as modules and could be made from a single ceramic layer or green sheet forming a single layer ceramic module or a plurality of ceramic layers forming an MLC (multi-layer ceramic) module.

While the remaining discussion will be directed to MLC modules, it should be understood that the teachings of the present invention can be equally applicable to single layer modules.

MLC modules having single or multiple cavities are normally used in the electronic industry to package high performance integrated circuits or chips (hereafter just chips). These high performance chips have a large number of external inputs/outputs (called I/Os), such as pads or solder balls, to name a few, and these chips have a very high power dissipation. In order to accommodate such high performance chips, the MLC module also has to provide a high number of external I/Os, such as pads, pins, solder balls, to name a few, and also be able to handle the very high power dissipation that is being generated both from the module as well as the chip. Further, there may also be wire bond pads on the shelves in the cavity.

The single or multiple cavities in an MLC substrate are normally laminated during the lamination process typically with the aid of a hard or soft insert as a plug such as that disclosed by Phillips in IBM Technical Disclosure Bulletin, "FIXTURE FOR FABRICATING COMPLEX SUBSTRATE DESIGN FROM GREEN SHEET CERAMICS", Vol. 16, No. 11, page 3559 (April 1974), the disclosure of which is incorporated by reference herein. This insert in turn prevents the collapse or deformation of the stacked green ceramic body during lamination. This method of producing single or multiple cavities requires machining of the inserts with high precision and with high level of surface finish.

Inherently, the cost of such inserts is very high compared to the cost of the substrate. Additionally, these inserts or plugs do not provide the flexibility of using the same inserts for cavities of various shapes and sizes. Furthermore, placing these inserts in the cavities and then subsequently removing them is an expensive process and many times removing them could lead to the delamination of the ceramic green sheets or other damage to the green ceramic body. Another drawback with these solid inserts is the need to clean them prior to every use to avoid the paste pull-outs or damage to the green ceramic layers or pads. Even with cleaning, paste pull-out often occurs due to the lack of an effective release layer.

Another method of producing these single or multiple cavities in the MLC substrate would be to machine the cavities after the green sheets have been stacked and laminated, but this would not be a cost effective way of producing parts in a high volume manufacturing operation.

It is also possible to form cavities in the MLC substrate with no inserts. This could be done for cases where the lamination conditions are such that there is no resulting deformation in the green ceramic body. In these cases, typically, the lamination pressures are very low and the green sheet formulation is such that the dimensional control of products is achieved by altering the sintering process. However, in a high volume manufacturing operation, tailoring the green sheet formulation and developing a sintering cycle for every product would be cost prohibitive and time consuming. Besides, this approach typically needs an adhesive between layers and multiple lamination steps to achieve the end result. Thus, some of the problems associated with this low pressure lamination process are that no process window for dimensional control is available for the sintered body. Delamination of the ceramic green sheets could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

The prior art has approached this problem in other ways as well.

U.S. Pat. No. 4,636,275 (Norell), the disclosure of which is incorporated herein by reference, discloses a method of fabricating an integrated circuit package having bonding pads in a stepped cavity using an elastic bladder.

U.S. Pat. No. 4,680,075 (McNeal et al.), the disclosure of which is incorporated herein by reference, discloses a method of fabricating an integrated circuit package having bonding pads in a stepped cavity using an thermoplastic plug.

U.S. Pat. No. 4,737,208 (Bloechle et al.), the disclosure of which is incorporated herein by reference, discloses a method of fabricating multilayer structures with nonplanar surfaces, such structures include structures with cavity formed therein.

In every cavity formation technique, it is essential that the material set is chosen such that a cavity profile with sharp corners and flat wire bonding shelves is achieved. When improper release and/or membrane materials are chosen, rounded edges and corners, sloped wire bond shelves and paste pullout are the result.

The present invention, however, solves these and other problems by the use of a decomposable surface film or layer that protects the cavity shelves and edges during lamination, but decomposes and burns off during the sintering cycle.

PURPOSES AND SUMMARY OF THE INVENTION

The invention is a novel apparatus and insertless method for forming cavity substrates using a thermally decomposable surface film.

Therefore, one purpose of the present invention is to provide an apparatus and method that will form cavities in a semiconductor substrate without the necessity of using an insert.

Another purpose of the present invention is to provide an apparatus and method that will form cavities in a semiconductor substrate without causing damage to the ceramic body or causing paste pull-outs.

Yet another purpose of the present invention is to provide a thermally decomposable surface film, which film is essential to the avoiding of damage to the ceramic body and paste pull-outs.

Therefore, in one aspect this invention comprises a method of forming an unsintered ceramic structure having at least one cavity, comprising the steps of:

(a) placing at least one ceramic green sheet having at least one cavity over a first plate;

(b) placing at least one planar, thermally decomposable layer over said cavity, wherein said thermally decomposable layer has the characteristics of being thermally bondable to said green sheet during a lamination step and being thermally decomposable without leaving any carbonaceous residue during a subsequent sintering step, (c) applying pressure to at least a portion of said thermally decomposable layer, such that at least a portion of said thermally decomposable layer conforms to at least a portion of said cavity to prevent the collapse of said cavity and said thermally decomposable layer further adheres to at least a portion of said at least one ceramic green sheet, and thereby forms said unsintered ceramic structure having at least one cavity.

In another aspect this invention comprises a structure comprising a semiconductor substrate, said substrate having at least one cavity and wherein at least a portion of said at least one cavity having at least one layer of a thermally decomposable material.

In yet another aspect this invention comprises an apparatus for forming protected cavities in at least one ceramic green sheet comprising:

(a) a first plate to support said at least one green sheet having at least one cavity, (b) means for aligning and placing at least one planar, thermally decomposable layer over at least a portion of said at least one green sheet and said cavity, (c) at least one pressure means to force said thermally decomposable layer to conform to said cavity and adhere to at least a portion of said cavity, and thereby forming protected cavities in at least one ceramic green sheet.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 1, is a plan view of a multi-layer ceramic (MLC) substrate having a cavity with two shelves.

FIG. 2, is a cross-sectional view of the MLC substrate of FIG. 1, taken along line A—A, showing undistorted and well-defined shelves and edges.

FIG. 3, is a cross-sectional view of an MLC substrate similar to FIG. 2, but showing distorted shelves and edges.

FIG. 4, is a cross-sectional view of an MLC substrate prior to lamination with the inventive thermally decomposable surface film readied for positioning on the green sheet laminate.

DETAILED DESCRIPTION OF THE INVENTION

Figure 5:
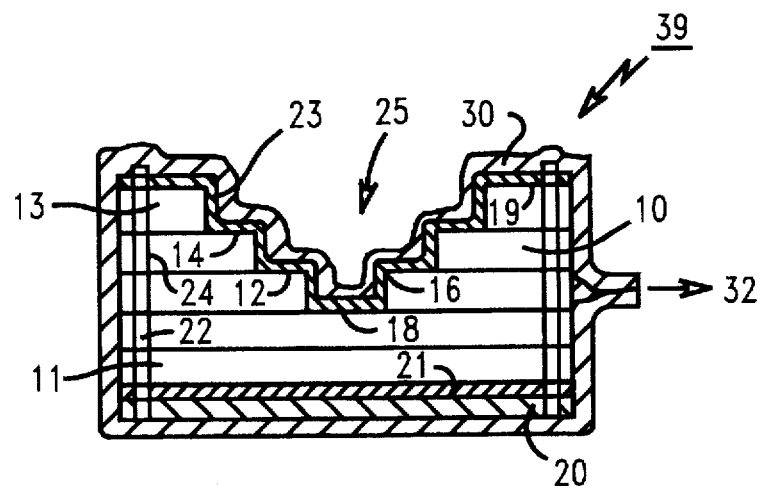
FIG. 5, is a cross-sectional view of the MLC substrate of FIG. 4, after being placed in an enclosure and evacuated.

Referring to the Figures in more detail, and particularly referring to FIGS. 1 and 2, there is shown a desired laminated and sintered cavity substrate 75, such as, a multi-layer ceramic (MLC) substrate 75, having a cavity 15, with base 18, and shelves 12 and 14. For the purposes of illustration only two shelves 12 and 14, are shown, however the cavity 15, could have a single or a plurality of shelves.

Individual ceramic green sheets 11 and 13, are typically used to build the MLC substrate 75. The green sheets 11, do not have any openings, while the green sheets 13, have an opening to form the cavity 15.

As used herein the term cavity means the structure that is created by the inner walls and inner surfaces of the green sheets 11 and/or 13. The cavity 15, could be a blind hole as shown in FIG. 2, created by the base 18, and the inner walls of the green sheets 13. However, for some cases the cavity 15, could be an open hole created by the inner walls of the green sheets 13, without the presence of any green sheet 11.

These green sheets 11 and 13, are typically fabricated using a tape casting process which is well known in the art. Briefly, large rolls or sheets of ceramic green sheets (i.e., unfired ceramic layers) are produced, then individual green sheets are blanked out of these large rolls or sheets of ceramic green sheets. Subsequently, individual ceramic green sheets 13, that will form the cavity 15, are also blanked or an open area is punched appropriately to form the ceramic layers 13, with the cavity 15.

Each of the ceramic green sheets 11 and 13, have at least one locating hole 24, for locating the green sheets with respect to the corresponding alignment pin 22, as best seen in FIG. 4. Usually, the number of locating holes 24, on each green sheet 11 and 13, will match the number of alignment pins 22.

Typically, the material for the ceramic layer 11 and/or 13, is selected from a group comprising alumina, alumina with glass frits, aluminum nitride, borosilicate glass and glass ceramic, although other ceramic materials may also be used.

Wiring metallurgy (not shown), which is also well known in the art, is then applied through a standard screening process onto one or more surfaces of the individual ceramic green sheets 11 and/or 13, including those parts of the green sheets 11 and/or 13, that will form shelves 12 and 14.

Base area 18, within the cavity 15, typically is dedicated for the attachment of a semiconductor chip (not shown), while area 19, is the upper surface of the desired cavity substrate 75.

The shelves 12 and 14, typically have pads (not shown) for electrical connection (for example, by wire bonds) to the chip which is secured to the area 18.

As more clearly shown in FIG. 2, the laminated and sintered cavity substrate 75, has well-defined sharp corners 16, and well-defined flat shelves 12 and 14, which are quite difficult to obtain in actual practice due to a variety of reasons, such as, for example, due to damage incurred during lamination, etc.

FIG. 2, also clearly shows that the substrate 75, has at least one shelf 12 and 14, and wherein at least a portion of an edge or corner 16, of the shelf 12 and/or 14, opens into the cavity 15.

FIG. 3, is a cross-sectional view of an MLC substrate 60, similar to the one shown in FIG. 2, but showing distorted shelves 12 and 14 and edges 16. Basically, the distorted laminated and/or fired substrate 60, of FIG. 3, has rounded corners 16 and non-existent shelves 12 and 14. Furthermore, portions of the shelves 12, have collapsed into and taken over real estate in the base area 18, thus preventing any chip attach in the base area 18. This deformation of the substrate 60, could happen either during lamination or during sintering. However, in most cases this distortion of the shelves occurs during the lamination process.

Referring now to FIG. 4, there is shown a first plate 20, preferably a metallic plate, having at least one alignment pin 22. Each of the ceramic green sheets 11 and/or 13, have at least one locating hole 24, best seen in FIG. 1, for locating the green sheets 11 and/or 13, with respect to the alignment pin 22. Usually, the number of locating holes 24, on each green sheet will match the number of alignment pins 22.

The green sheets 11 and/or 13, are then stacked in the appropriate order on first plate 20, utilizing alignment pins 22, to form an unfired substrate 10, that may not have gone through a lamination process, having the cavity 15.

Preferably, there will also be a sheet of non-sticking separator material 21, placed between the first plate 20, and the first green sheet 11 or 13, of the unfired cavity substrate 10. The non-sticking separator material 21, is chosen so that it will not adhere to the first plate 20, or to the first green sheet 11 or 13, of the unfired cavity substrate 10. This will also ensure that under pressure, the first ceramic green sheet 11 or 13, of the unfired cavity substrate 10, does not adhere or stick to the surface of the first plate 20. The preferred non-sticking separator material 21, is a polymeric sheet material that has minimal or no affinity for the ceramic 11 or 13, or the metallurgical materials adhered to the green sheets 11 or 13, which are used to build the unfired cavity substrate 10.

Some examples of non-sticky separator material are polymers such as Mylar, if rigidity and low elongation are required, or latex rubber or polyethylene if high elongation are required. Generally, the non-sticking separator material 21, should be selected from the group comprising elastomers, Mylar, latex rubber, polyester, polyethylene or polyurethane, to name a few.

After all the green sheets 11 and/or 13, have been stacked over the separator material 21, and the first plate 20, using at least one alignment pin 22, at least one planar, thermally decomposable film in the sheet form 23, is then placed over the unfired cavity substrate 10, again using alignment pins 22, and the locating holes 24.

As is evident from FIG. 4, the planar surface of the decomposable film 23, is flat and in no way conforms to the shape of the cavity 15. In other words, the planar, decomposable surface film 23, is not a preformed insert. However, the planar, surface film 23, should be of a material that will only conform to the shape of the cavity 15, when an external pressure and heat is applied, as will be discussed and described in more detail hereafter.

The choice for the thermally decomposable surface film 23, is very important to the present invention. It should be flexible, soft and moldable with softening temperature below the lamination temperature. It should have elongation above 150 percent at room temperature and be bondable to the green ceramic surface. Furthermore, the decomposable film 23, should be thermally decomposable below about 550° C., without leaving any carbon or other detrimental residue. This decomposable layer 23, should also be tough and tear-resistant during lamination, i.e., it distributes the lamination stress and allows for uniform pressure distribution. These above-mentioned properties are important so that when the thermally decomposable surface film 23, is caused to conform to the shape of the cavity 15, the sharp corners 16, of the cavity 25, do not become rounded and the cavity shelves 12 and 14, do not become distorted. Suitable materials for the surface film 23, are Parafilm "M" and Parafilm "F" (Trade Marks of American Can Company, Greenwich, Conn., USA) and like thermoplastic materials. Generally speaking, the paraffin wax plus polyethylene compound material is best for all laminating pressures, including laminating at higher pressures above about 2500 psi and any lamination temperatures from about 45° C. to about 90° C. Furthermore, the material thickness is also of importance. The maximum thicknesses for the thermally decomposable material 23, should be less than about 10 mil to have high yield in lamination process and high throughput in the sinter furnace.

Referring now to FIG. 5, at least one environmental enclosure 30, is placed around the assembly of FIG. 4, i.e., the first plate 20, the non-sticking separator material 21, the alignment pins 22, the unfired cavity substrate 10, and the planar, thermally decomposable surface film 23, to form the assembly 39. The enclosure 30, is then evacuated, as indicated by arrow 32, and the enclosure 30, collapses and forces the decomposable surface film 23, to also collapse and conform to the surface contour of the unfired cavity substrate 10, including the cavity 15. The environmental enclosure 30, is then sealed by methods well known in the art.

As can be clearly seen in the assembly 39, of FIG. 5, that both the decomposable surface film 23, and the enclosure 30, now conform to the shape of the unfired cavity substrate 10, including the cavity 15. The material for the enclosure 30, may comprise, for example, polyurethane, very thin Mylar film, polyethylene or copolymers of polyethylene, to name a few.

The whole assembly 39, as shown in FIG. 5, is now ready for the lamination process of the green sheets 11 and 13. For this lamination process isostatic pressure is preferred. The isostatic pressure may be applied by placing the whole assembly 39, in a fluid, such as, water or a gas (e.g., air or nitrogen). Care should be taken during this lamination process that the fluid employed does not interact or degrade the enclosure 30, or seep into the enclosure 30, to contaminate its contents. For some green sheet materials 11 and 13, it may also be desired to heat the assembly 39, to a temperature of say about 75° C. during the lamination process.

Strictly speaking, the enclosure 30, is not even necessary if the isostatic pressure is applied by a gas. However, the enclosure 30, is desirable because it causes the decomposable membrane or sheet 23, to conform to the shape of the cavity 15, during the evacuation process of the enclosure 30.

After the lamination process the assembly 39, is removed from the lamination environment and the enclosure 30, is removed or peeled off. The rest of the assembly having the laminated green sheets 11 and 13, and the conformal decomposable material or layer 23, are now ready for the sintering process.

Figure 6:
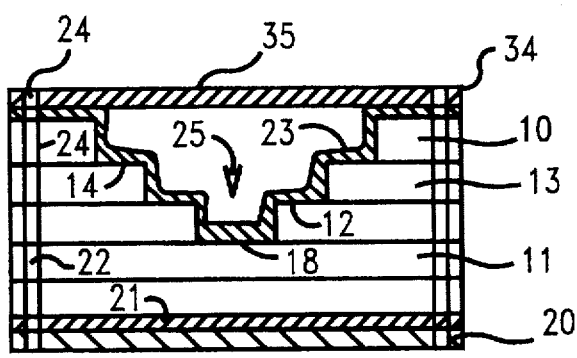
FIG. 6, is a cross-sectional view of another embodiment of a MLC substrate during lamination with a thermally decomposable film conforming to the cavity.

Referring now to FIG. 6, there is shown a further embodiment of the present invention. The embodiment of FIG. 6, is similar to the embodiment of FIG. 5, except that in FIG. 6, there is no enclosure 30. In addition, the apparatus in FIG. 6, further includes at least one second plate 34, having at least one alignment aperture 24, for alignment with alignment pins 22, and at least one opening or aperture 35.

Basically, the decomposable 34, is placed above the decomposable membrane 23, and preferably uniaxial pressure is applied, such as, by a ram (not shown), against the second plate 34, to cause lamination of the green sheets 11 and 13, of the unfired cavity substrate 10.

A fluid, preferably a gas, would be applied through the aperture 35, of the second plate 34, which cause the thermally decomposable surface film 23, to conform to the shape of the cavity 15, and to protect the cavity 15, during lamination process.

Under some conditions it would be preferable that the apparatus is also heated, to say about 75° C., during the lamination process to help facilitate the lamination process.

After lamination, the second plate 34, is removed, followed by the removal of the unfired cavity substrate 10, from first plate 20. During this lamination process the decomposable surface film 23, has been bonded to the surface of the unfired cavity substrate 10.

Figure 7:
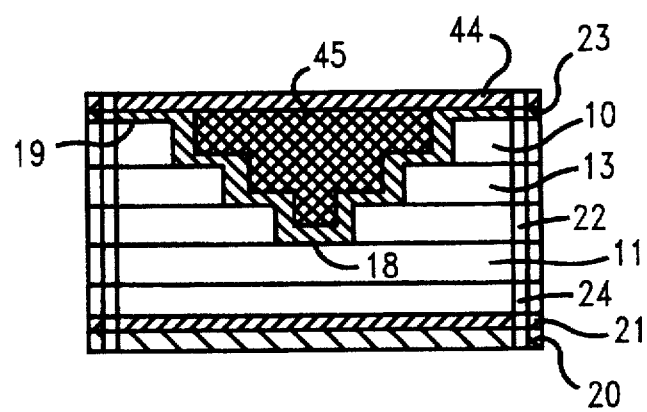
FIG. 7, is a cross-sectional view of yet another embodiment of a MLC substrate during lamination with a thermally decomposable film conforming to the cavity and with an insert in the cavity.

Another embodiment of adhering the decomposable surface film 23, to the cavity 15, is illustrated in FIG. 7. The embodiment of FIG. 7, is similar to that shown in FIG. 6, except that second plate 44, does not need to have an aperture, such as, aperture 35, for application of a fluid, such as, gas, and that the second plate 44, now sits over an insert 45. It should be understood that for some applications that the second plate 44, and the insert 45, could be just one piece.

After the decomposable layer or film 23, has been placed over the unfired cavity substrate 10, as shown in FIG. 4, and has formed a portion of the cavity 25, the insert 45, would then be pressed into the cavity 15, by the second plate 44, causing the decomposable film 23, to conform to the shape of the cavity 15.

Further application of a pressure against the second plate 44, such as, by a ram (not shown), would cause the lamination of the green sheets 11 and 13, of the unfired cavity substrate 10. Again, for some lamination processes the apparatus could also heated to say about 75° C., during the lamination process to help facilitate the lamination process.

After lamination, the second plate 44, and the insert 45, are removed, followed by the removal of the unfired cavity substrate 10, from first plate 20. This laminated structure comprising the laminated green sheets 11 and 13, and the decomposable layer 23, are now ready for the sintering cycle.

Figure 8:
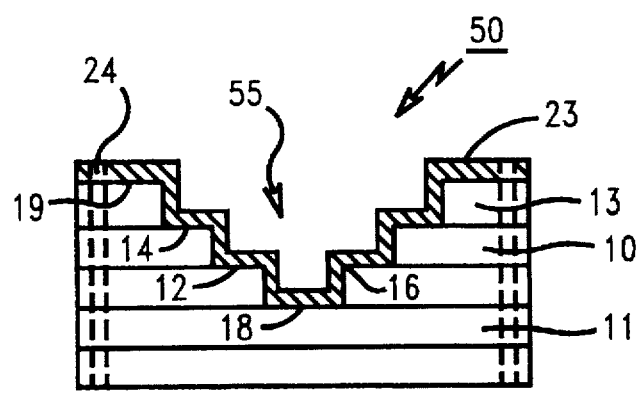
FIG. 8, is a cross-sectional view of a cavity substrate made according to the process of this invention showing the decomposable film adhering to and protecting the cavity edges and shelves after lamination but prior to sintering.

Cavity substrate 50, shown in FIG. 8, is illustrative of that obtained by Applicants' inventive apparatus and method. The laminated structure 50, has a well defined cavity 55, with flat cavity steps 12 and 14, and base 18, and well defined sharp corners 16. The decomposable layer 23, is bonded onto the surface of the cavity 15.

The laminated semiconductor structure 50, can now be either stored for future sintering or can now go into sintering. As stated earlier, the decomposable layer 23, will be burnt-off early in the sintering cycle, i.e., before the on-set of densification.

After the laminated green sheet with decomposable structure 50, has gone through a sintering cycle, and the decomposable layer 23, has been burnt-off, one would get the desired laminated and sintered cavity substrate 75, as clearly shown in FIGS. 1 and 2.

It is preferred that the decomposable surface film 23, has an elongation of greater than 150 percent at the room temperature and be thermally decomposable below about 550° C. without leaving any carbon or other detrimental residue. Of course the decomposable layer 23, should be of a material that is bondable to the green ceramic sheets 11 and 13, at the lamination temperatures.

It should be appreciated that at least one of the primary ingredient of one of the thermally decomposable layer 23, should be paraffin wax. However, at least one of the secondary material for at least one of the thermally decomposable layer 23, could be selected from a group comprising of polyethylene, polyurethane or polypropylene.

EXAMPLES

The various aspects of the present invention are further illustrated by referring to the following examples which are intended only to further illustrate the invention and are not intended to limit the scope of the present invention in any manner.

Example 1

Several samples of the multilayer ceramic bodies containing cavities were fabricated using the process of this invention.

In one sample a stack of cavity containing metallized ceramic layers 13, were placed in a lamination frame, and the ceramic layers 13, were separated from the bottom lamination plate 20, by a layer of Mylar 21. A decomposable surface layer of parafilm M 23, was then placed over the cavity 15. The flexible thermoplastic parafilm M 23, was 5 mil thick and had an elongation of about 200 percent at room temperature. This film was made by American National Can, Chicago, Ill., USA.

This assembly was then placed inside a 3 mil thick polyurethane bag (30 durometer shore A) 30, evacuated and heat sealed. The polyurethane bag 30, was obtained from Stevens Urethane Film & Sheet, Northampton, Mass., USA. The bag 30, with its contents were then laminated under pressure to about 5000 psi and at a temperature to about 90° C. in an isostatic press.

After the lamination the cavity substrate 10, was then removed from the bag 30, and inspected. The parafilm 23, formed a well bonded surface coating on the unfired substrate 10. It was also found that the cavity 15, and the ceramic body had good dimensional control. More significantly, due to the surface coating/sealing and the nature of the base coated surface, there was no paste-pull under these severe lamination conditions.

The green laminate was then sintered in a sintering furnace in the usual way. During the pyrolysis and binder removal segments of the sinter cycle the parafilm decomposed entirely without leaving any residue in the ceramic body or surface damage to the ceramic substrate. Both ESCA surface analysis and Leco carbon analysis were used to test the carbon residue. This material and process yielded a very inexpensive insertless cavity formation method.

Example 2

In another set of samples the assembly of ceramic layers 11 and 13, were stacked and laminated in a manner described in Example 1, but no decomposable surface layer parafilm M 23, was used. These samples produced good dimensional control for both cavity and ceramic body, but they had very severe paste and ceramic pull by the bag material and also by the lamination plate. Thus demonstrating the need for the decomposable interface layer and the process of this invention.

Example 3

In another series of samples, an assembly of ceramic layers were stacked and laminated in a manner described in Example 1, however, the bag material used was of a commercially available polyester type. Most of these samples produced no paste or ceramic pull.

The dimensional control for both the cavity 15, and the ceramic body 10, was good for pressures up to about 2000 psi, however, it got worse when the lamination pressure was set above 2000 psi. Thus again demonstrating the need for the process of this invention.

Example 4

In another series of sample different types of decomposable surface films 23, were used. Basically, the assembly of metallized ceramic layers containing the multi-step cavity design and the individual ceramic layers were stacked and placed in the lamination frame.

The decomposable films tried were made of copolymers of polyethylene and paraffin wax for some samples, polyurethane and paraffin wax for other samples and polypropylene and paraffin wax for some other samples. The characteristics of these decomposable films 23, ranged from a thickness of about 2 mils to about 10 mils, with elongation from about 150 percent to about 550 percent, while the modulus was in the range from about 0.03 to about 0.3 GPa.

The rest of the assembly and the procedure followed was similar to the one explained in Example 1. After the cavity substrate 10, had been laminated, the cavity substrate was inspected. It was found that the laminated structure and the multi-step cavity dimensions were within the desired specifications for silicone coated polyurethane based surface layer with polyurethane bag for all pressures up to about 5500 psi.

However, with some decomposable film materials, the required dimensions could be met only up to about 3000 psi. However, there was no paste pull-outs in all cases, as the adhered surface film 23, protected the screened features and the ceramic.

Example 5

In this example, an assembly of ceramic layers were stacked and laminated in a manner described in Example 1, except that a preformed insert 45, was used in the cavity 15, between the decomposable surface film 23, and the top lamination plate 44. The lamination pressure applied was from a hydraulic press. Lamination occurred at a pressure of about 4,500 psi and at a temperature of about 75° C.

After the cavity substrate 10, had been laminated, the cavity 15, was inspected. It was found that the cavity structure and dimensions were within the desired specification. The screened features and ceramic were protected by the adhered surface film 23.

The surface finish and the cleanliness of the insert 45, used was purposely made sub-standard, compared to when decomposable surface film was used. Since the surface of the insert 45, does not touch or come into direct contact with the cavity 25, more economical inserts 45, could be used.

Furthermore, the quality of the product is not dependent on the quality of the insert used, due to the inventive coated membrane process of the present invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for forming protected cavities in at least one ceramic green sheet comprising:
   (a) a first plate to support said at least one green sheet having at least one cavity having a surface contour,
   (b) means for aligning and placing at least one planar, thermally decomposable layer over at least a portion of said at least one green sheet and said cavity,
   (c) at least one pressure means to force said thermally decomposable layer to conform and adhere to said surface contour of said cavity and to form a surface contour similar to said surface contour of said cavity, and thereby forming protected cavities in at least one ceramic green sheet.

2. The apparatus of claim 1, wherein there are at least two ceramic green sheets and wherein said pressure means also forces lamination of said two ceramic green sheets.

3. The apparatus of claim 1, wherein a primary ingredient of said thermally decomposable layer is paraffin wax.

4. The apparatus of claim 1, wherein a primary ingredient of said thermally decomposable layer is paraffin wax, and wherein secondary material for said thermally decomposable layer is selected from a group consisting of polyethylene, polyurethane and polypropylene.

5. The apparatus of claim 1, wherein said pressure means applies a pressure of less than about 2500 psi.

6. The apparatus of claim 1, wherein said pressure means applies a pressure of more than about 2500 psi.

7. The apparatus of claim 1, wherein said pressure means is selected from a group consisting of isostatic pressure, hydrodynamic pressure or hydraulic pressure.

8. The apparatus of claim 1, wherein said first plate, said at least one ceramic green sheet and said at least one thermally decomposable layer are inside at least one environmental enclosure.

9. The apparatus of claim 8, further comprising means for evacuating said environmental enclosure so that said environmental enclosure collapses and conforms to said at least one thermally decomposable layer.

10. The apparatus of claim 1, wherein said pressure means comprise at least one second plate having at least one opening over said thermally decomposable layer, such that pressure through said at least one opening in said second plate forces said at least one thermally decomposable layer to follow at least a portion of said cavity and adhere to at least a portion of said at least one ceramic green sheet.

11. The apparatus of claim 1, wherein said pressure means comprise at least one preformed insert over said thermally decomposable layer, such that pressure on said preformed insert forces said at least one thermally decomposable layer to follow at least a portion of said cavity and adhere to at least a portion of said at least one ceramic green sheet.

12. The apparatus of claim 1, wherein said thermally decomposable layer is flexible, moldable with softening temperature below about 75° C. and has an elongation above about 150 percent.

13. The apparatus of claim 1, wherein material for said green sheet is selected from a group consisting of ceramic and glass ceramic.

14. The apparatus of claim 1, wherein said apparatus has at least one alignment pin to align said at least one green sheet.

15. The apparatus of claim 1, wherein said apparatus has at least one alignment pin corresponding to an alignment hole in said green sheet to align said at least one green sheet.

16. A structure comprising a semiconductor substrate, said substrate having at least one cavity having a surface contour and at least one layer of a thermally decomposable material having two opposed principal surfaces, said at least one layer of a thermally decomposable material covering at least a portion of said substrate and said surface contour of said cavity and both of said opposed principal surfaces forming a surface contour similar to the surface contour of said cavity, thereby forming a protected cavity in said substrate.

17. The structure of claim 1, wherein a primary ingredient of said thermally decomposable material is paraffin wax.

18. The structure of claim 1, wherein a primary ingredient of said thermally decomposable material is paraffin wax, and wherein secondary material for said thermally decomposable layer is selected from a group consisting of polyethylene, polyurethane and polypropylene.

19. The structure of claim 1, wherein said substrate has at least one shelf, and wherein at least a portion of an edge of said at least one shelf opens into said cavity.

20. The structure of claim 19, wherein said shelf has at least one means for at least one electrical connection.

21. The structure of claim 1, wherein said semiconductor substrate is selected from a group consisting of multilayer ceramic substrate and glass ceramic substrate.

22. The structure of claim 1, wherein said substrate has at least one alignment hole.

23. The structure of claim 1 wherein said cavity has a depth that varies from a minimum at an edge of the cavity to a maximum at the center of the cavity and said at least one layer of thermally decomposable material covering said surface contour has a thickness that is less than the minimum depth of said cavity.

24. The structure of claim 1 wherein said at least one layer of thermally decomposable material covering said surface contour has a thickness that is constant over the entire said surface contour.

* * * * *